United States Patent [19]
Yasuda

[11] Patent Number: 5,191,334
[45] Date of Patent: Mar. 2, 1993

[54] SAMPLING FREQUENCY CONVERSION APPARATUS

[75] Inventor: Akira Yasuda, Kawasaki, Japan

[73] Assignee: Kabushiki Kaisha Toshiba, Kawasaki, Japan

[21] Appl. No.: 721,683

[22] Filed: Jun. 26, 1991

[30] Foreign Application Priority Data

Jun. 27, 1990 [JP] Japan .................. 2-172030

[51] Int. Cl.⁵ ............................ H03M 7/00
[52] U.S. Cl. ..................... 341/61; 341/50
[58] Field of Search .......... 341/61, 95, 122, 123, 341/143, 50; 375/30, 25, 34; 358/138

[56] References Cited

U.S. PATENT DOCUMENTS

| | | | |
|---|---|---|---|
| 4,035,724 | 7/1977 | Stephenne et al. | 325/38 B |
| 4,870,661 | 9/1989 | Yamada et al. | 375/122 |
| 4,903,019 | 2/1990 | Ito | 341/61 |

FOREIGN PATENT DOCUMENTS

2-257712 10/1990 Japan.
8602217 4/1986 PCT Int'l Appl.

OTHER PUBLICATIONS

"Monolithic Decimation Filtering for Custom Delta-Sigma A/D Converters", Int'l Conf. on Acoustics, Speech, and Signal Processing, Apr. 11–14, 1988, vol. IV, Max W. Hauser et al, pp. 2005–2008.

"A Fast Algorithm for the Design of Narrow–Band Multirate Digital Filters", Int'l Conf. on Acoustics, Speech, and Signal Processing, Apr. 6–9, 1987, vol. 4 of 4, Eric Viscito et al, pp. 2177–2180.

"Multiplier–Free Decimator Algorithms for Superresolution Oversampled Converters", Int'l Symposium on Circuits and Systems, May 1–3, 1990, vol. 4 of 4, Tapio Saramaki et al, pp. 3275–3278.

"A 16–bit Oversampling A-to-D Conversion Technology Using Triple–Integration Noise Shaping", IEEE Journal of Solid-State Circuits, vol. SC-22, No. 6, Dec. 1987, Yasuyuki Matsuya et al, pp. 921–929.

*Primary Examiner*—Todd E. DeBoer
*Assistant Examiner*—Brian Young
*Attorney, Agent, or Firm*—Oblon, Spivak, McClelland, Maier & Neustadt

[57] ABSTRACT

A sampling frequency conversion apparatus having N (where N is an integer, which is two or more) sampling conversion means serially connected, each of the N sampling frequency conversion means comprising a first digital filter for outputting a signal with longer bit length than that of an input signal, and first sampling means for sampling a signal which is output from the digital filter at a sampling frequency, the sampling frequency decreasing as the stage of the sampling frequency conversion means becomes later. Thus, the earlier stages which should be operated at a high speed, the bit length of signals becomes short. In the later stages where the bit length becomes long, the sampling frequencies are decreased. Consequently, the apparatus can be operated at a high speed and constructed at a low cost.

10 Claims, 8 Drawing Sheets

SAMPLING FREQUENCY CONVERSION APPARATUS

BACKGROUND OF THE INVENTION

1. Field of the Invention

The present invention relates to a sampling frequency conversion apparatus for resampling a signal being over-sampled.

2. Description of the Related Art

To further accurately handle an analog amount, signals are digitalized and then they are processed. In such a digital signal process, an original signal is sampled with a particular frequency. Occasionally, an over-sampling where a signal is sampled with a higher frequency than the sampling frequency is performed. In the over-sampling, since the sampling frequency is increased, quantizing noise produced by the sampling is dispersed to a wide frequency band and thereby the quantizing noise in the signal band is reduced.

After the signal is over-sampled, it is resampled to a signal with the conventional sample frequency. However, when the signal which has been over-sampled is resampled, all components in the band ranging from fsr/2 to fso (where fso=over-sampling frequency; fs=resampling frequency) become aliasing noise ranging from 0 to fsr. Thus, it is impossible to separate the original signal. In particular, in an over-sampling type A/D converter with a noise shaping characteristic like a $\Delta\Sigma$ modulation type A/D converter, the high band quantizing noise which is increased by the noise shaping is aliasing to the signal band by the resampling. To prevent that, with a so-called decimation filter with a characteristic as shown in FIG. 8, the components which are aliasing to the signal band are attenuated before the resampling is performed.

Figure 9:
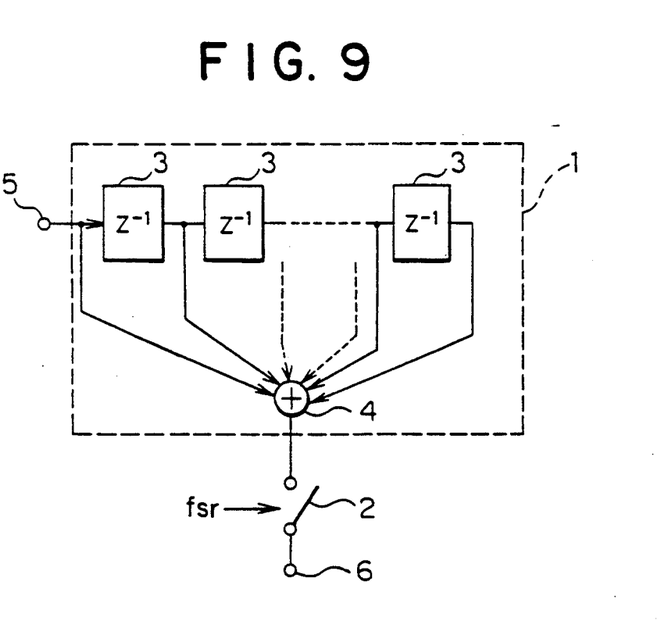
FIG. 9 is a block diagram showing the construction of the conventional sampling frequency conversion apparatus provided with a decimation filter.

FIG. 9 is a block diagram describing the operation of a sampling frequency conversion apparatus with such a decimation filter.

In the figure, reference numeral 1 represents a movement averaging filter. Reference numeral 2 represents a resampler. The movement averaging filter 1 is composed of m (positive integer) delay devices 3 and an adder 4. Reference numeral 5 represents an input terminal. Reference numeral 6 represents an output terminal.

Figure 8:
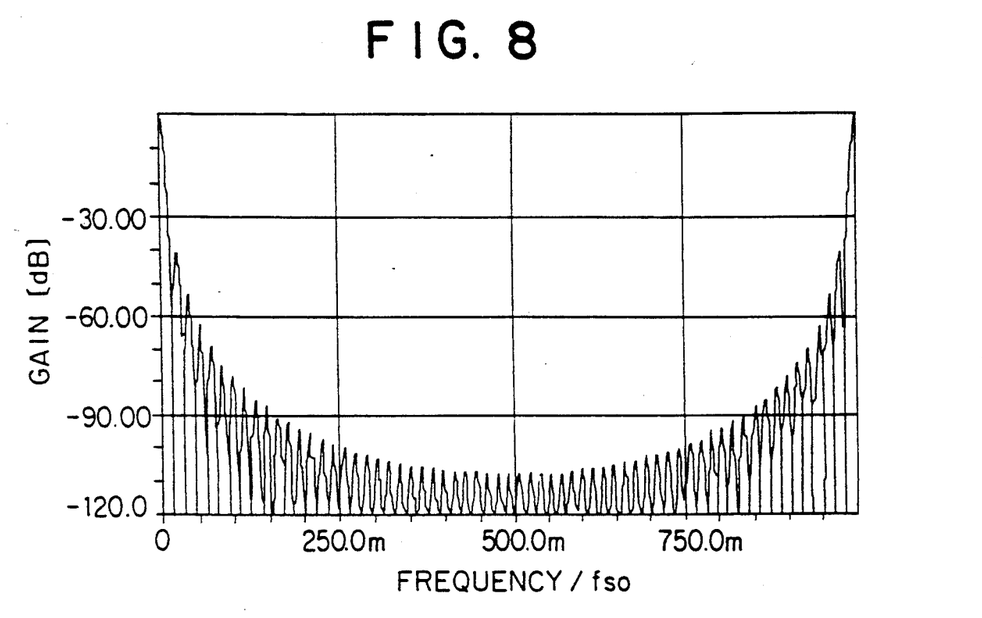
FIG. 8 is a chart showing the characteristic of a decimation filter used for the conventional sampling frequency conversion apparatus.

The movement averaging filter 1 causes the delay devices 3 to delay an input signal by one sample and causes the adder 4 to add m delay signals so as to obtain a characteristic shown in FIG. 8. After the components which become aliasing noise are satisfactorily attenuated by the movement averaging filter 1, the signal is resampled with the conventional sampling frequency fsr by the resampler 2.

However, actually, the sampling frequency conversion apparatus as shown in FIG. 9 does not add the delay signals of the m delay devices 3 at the same time. Instead, the apparatus has the construction in accordance with the block diagram shown in FIG. 10 so that the adder 11 accumulates the delay signals one by one. And thereby the circuit becomes small.

Figure 10:
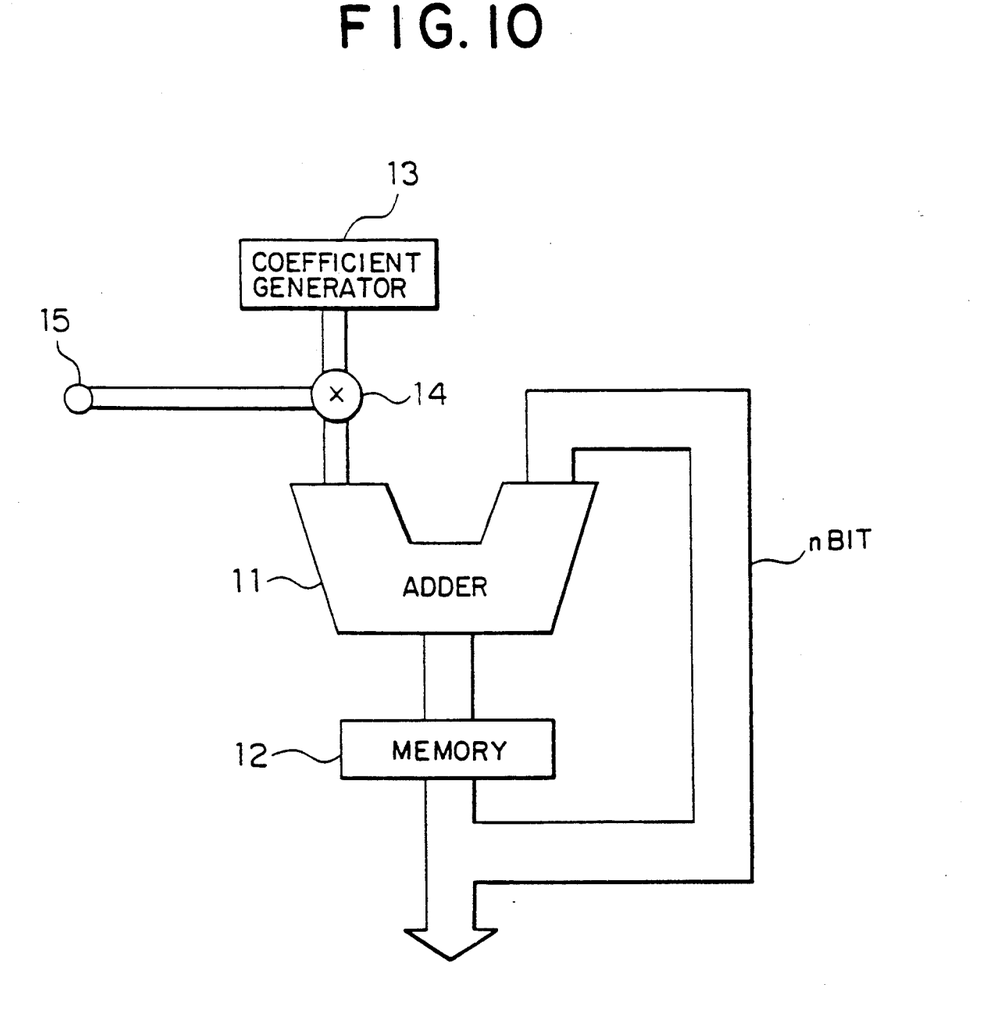
FIG. 10 is a block diagram showing the construction where the size of the conventional sampling frequency conversion apparatus shown in FIG. 9 is reduced.

As shown in the figure, in such a construction, a signal stored in a memory 12 by the adder 11 is added m times so as to obtain a particular characteristic. Reference numeral 13 represents a coefficient generator. Reference numeral 14 represents a multiplier. Reference numeral 15 represents an input terminal.

Nevertheless, when the sampling frequency is decreased by 1/n times, since the operation speed of the adder 11 which is n times higher than that of the adder 4 shown in FIG. 9 is required, it was difficult to operate the apparatus at a high speed.

As is described above, since the conventional sampling frequency conversion apparatus requires n-order decimation filters so as to decrease the sampling frequency by 1/n times, the circuit size becomes very large.

SUMMARY OF THE INVENTION

Therefore, an object of the present invention is to solve such a problem and to provide a sampling frequency conversion apparatus which operates at a high speed in a small circuit size.

To accomplish the above object, the apparatus according to the present invention has N (where N is an integer, which is two or more) sampling conversion means serially connected, wherein each of the N sampling frequency conversion means comprises a first digital filter for outputting a signal with a longer bit length than that of an input signal, and first sampling means for sampling a signal which is output from the digital filter with a sampling frequency, the sampling frequency decreasing as the stage of the sampling frequency conversion means becomes later.

In other words, when the sampling rate is decreased by for example 1/n times, n is resolved into several factors like $n = a \times b \times c$ and then a plurality of sampling frequency converters with respective sampling rates of 1/a, 1/b, and 1/c are serially connected. Thus, a sampling frequency conversion apparatus with a sampling rate of 1/n is finally accomplished.

Consequently, since the number of orders per stage becomes small, the circuit size becomes small. Moreover, in the earlier stages which should operate at a high speed, the bit length of signals is short. On the other hand, in the later states where the bit length is long, the sampling frequency is decreased. Thus, the apparatus can be readily operated at a high speed.

DESCRIPTION OF PREFERRED EMBODIMENTS

Now, with reference to the accompanying drawings, embodiments according to the present will be described.

Figure 1:
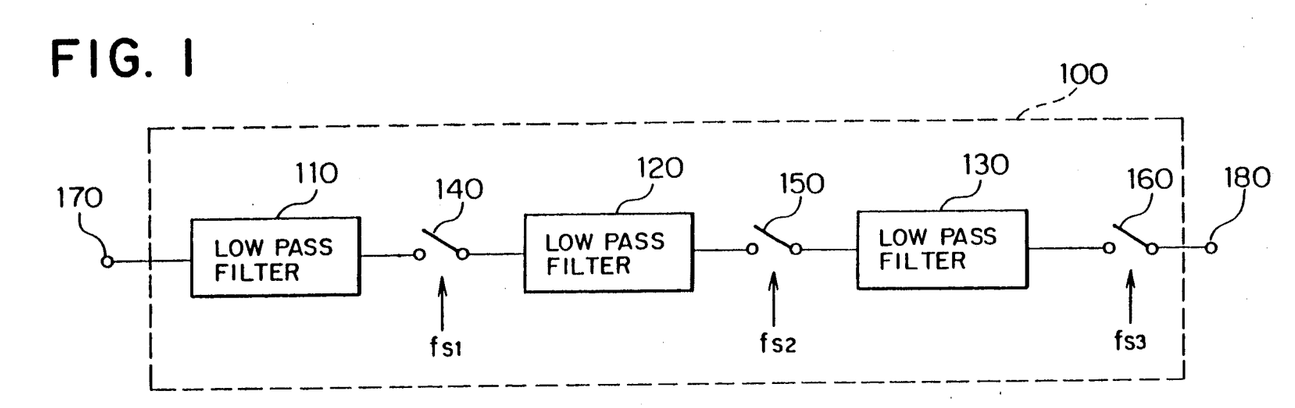
FIG. 1 is a block diagram showing the construction of an embodiment of a sampling frequency conversion apparatus according to the present invention.

FIG. 1 is a block diagram showing the construction of a sampling frequency conversion apparatus of one embodiment according to the present invention.

As shown in the figure, a sampling frequency conversion apparatus 100 is composed of low pass filters 110, 120, and 130, and sampling means 140, 150, and 160. The low pass filter 110, the sampling means 140, the low pass filter 120, the sampling means 150, the low pass filter 130, and the sampling means 160 are serially connected in the order thereof. Reference numeral 170 represents an input terminal. Reference numeral 180 represents an output terminal.

Figure 2:
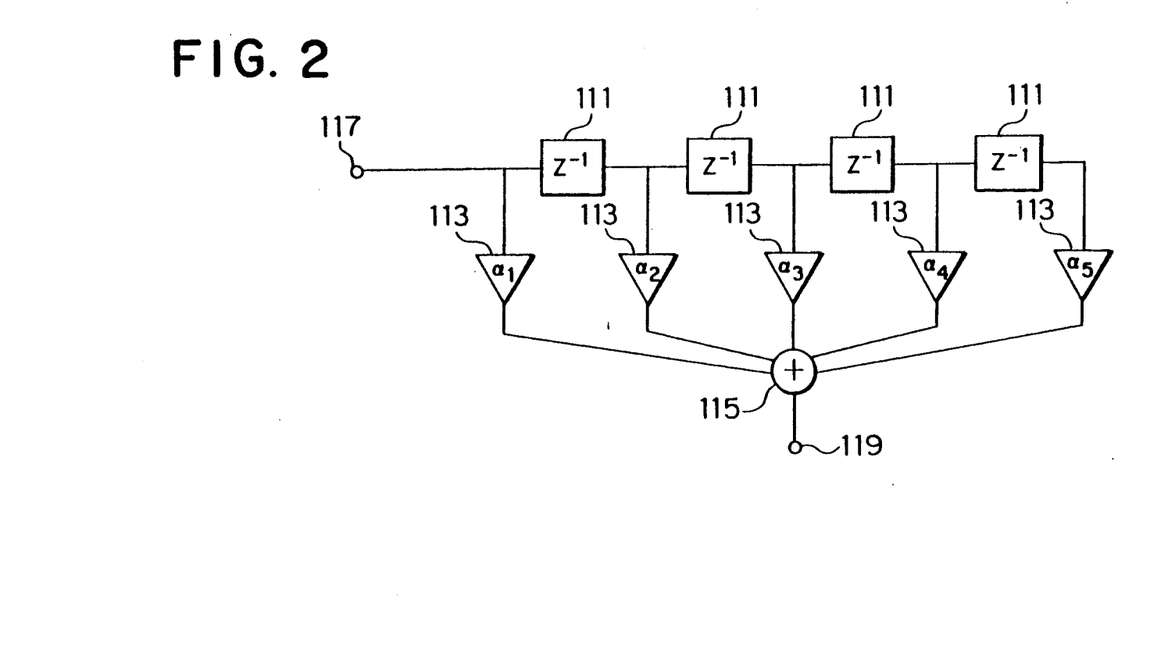
FIG. 2 is a block diagram showing an example of the construction of a low pass filter used for the sampling frequency conversion apparatus shown in FIG. 1.

The low pass filters 110, 120, and 130 can be composed of, for example, FIR (Finite Impulse Response) filters as shown in FIG. 2.

In the figure, reference numeral 111 represents a delay device for delaying an input signal by one sampling cycle. Reference numeral 113 represents a multiplier for multiplying the signal by a particular coefficient. Reference 115 represents an adder for adding the results of multiplications of the multipliers 113. Reference numeral 117 represents an input terminal. Reference numeral 119 represents an output terminal.

When the sampling frequency conversion apparatus 100 decreases the sampling frequency by 1/n times, n is factorized into three numbers. For example, when n is factorized as $n = a \times b \times c$, resampling frequencies fs1, fs2, and fs3 of the sampling means 140, 150, and 160 are set so that they become 1/a, 1/b, and 1/c of the sampling frequencies on the just preceding stages thereof, respectively. In addition, the characteristics of the low pass filters 110, 120, and 130 are set so that the noise attenuation becomes most suitable in accordance with the resampling frequencies fs1, fs2, and fs3, respectively.

When a signal of a sampling frequency of fso is input from the input terminal 170, signals in a band to become aliasing noise components are removed by the low pass filter 110. Thereafter, the resultant signals are resampled at a frequency of $fs1 = fso/a$ by the resampler 140. Thereafter, signals in a band to become aliasing noise components are removed by the low pass filter 120. Thereafter, the resultant signals are resampled at a frequency of $fs2 = fso/(a \times b)$ by the resampler 150. Thereafter, signals in a band to become aliasing noise components are removed by the low pass filter 130. Thereafter, the resultant signals are resampled with a frequency of $fs3 = fso/(a \times b \times c)$ by the resampler 160.

In other words, when the resamplers are serially connected in three stages so that the sampling frequencies become 1/a, 1/b, and 1/c, the resultant sampling frequency is decreased by 1/n times. Thus, only the earlier stages composed of the low pass filter 110, the resampler 140, and so forth should be operated at a high speed. The later stages can be operated at a relatively low speed. Since the low pass filters and the resamplers are divided into a plurality of stages and the sampling frequencies are accordingly decreased, with low order low pass filters, the sampling frequency conversion apparatus can be constructed.

Figure 3:
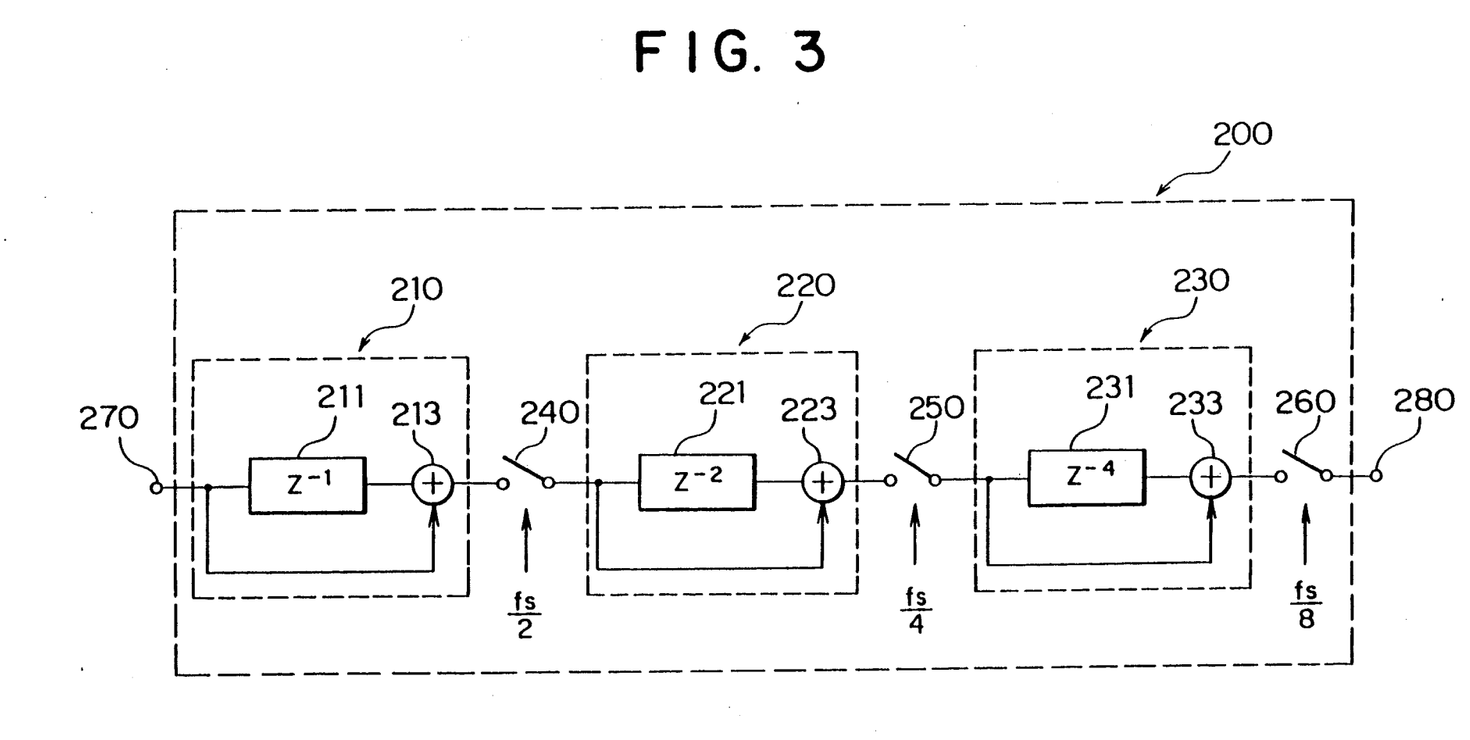
FIG. 3 is a block diagram showing the construction of a sampling frequency conversion apparatus of another embodiment according to the present invention.

FIG. 3 is a block diagram showing the construction of another embodiment according to the present invention.

As shown in the figure, a sampling frequency conversion apparatus 200 is composed of a low pass filter 210, a resampler 240, a low pass filter 220, a resampler 250, a low pass filter 230, and a resampler 260, which are serially connected in the order thereof. Reference numeral 270 represents an input terminal. Reference numeral 280 represents an output terminal.

The low pass filter 210 is composed of a delay device 211 for delaying a signal by one sampling cycle and an adder 213. The low pass filter 220 is composed of a delay device 221 for delaying a signal by two sampling cycles and an adder 223. The low pass filter 230 is composed of a delay device 231 for delaying a signal by four sampling cycles and an adder 233.

When the oversampling frequency is fs, the resampling frequencies of the resamplers 240, 250, and 260 are expressed as fs/2, fs/4, and fs/8. Thus, the later the stage of the low pass filter, the slower the operation. In addition, since each of the low pass filters is constructed with a 1st-order low pass filter, the circuit size becomes very small. Moreover, the characteristics of this embodiment are the same as that of the conventional decimation filter.

Figure 4:
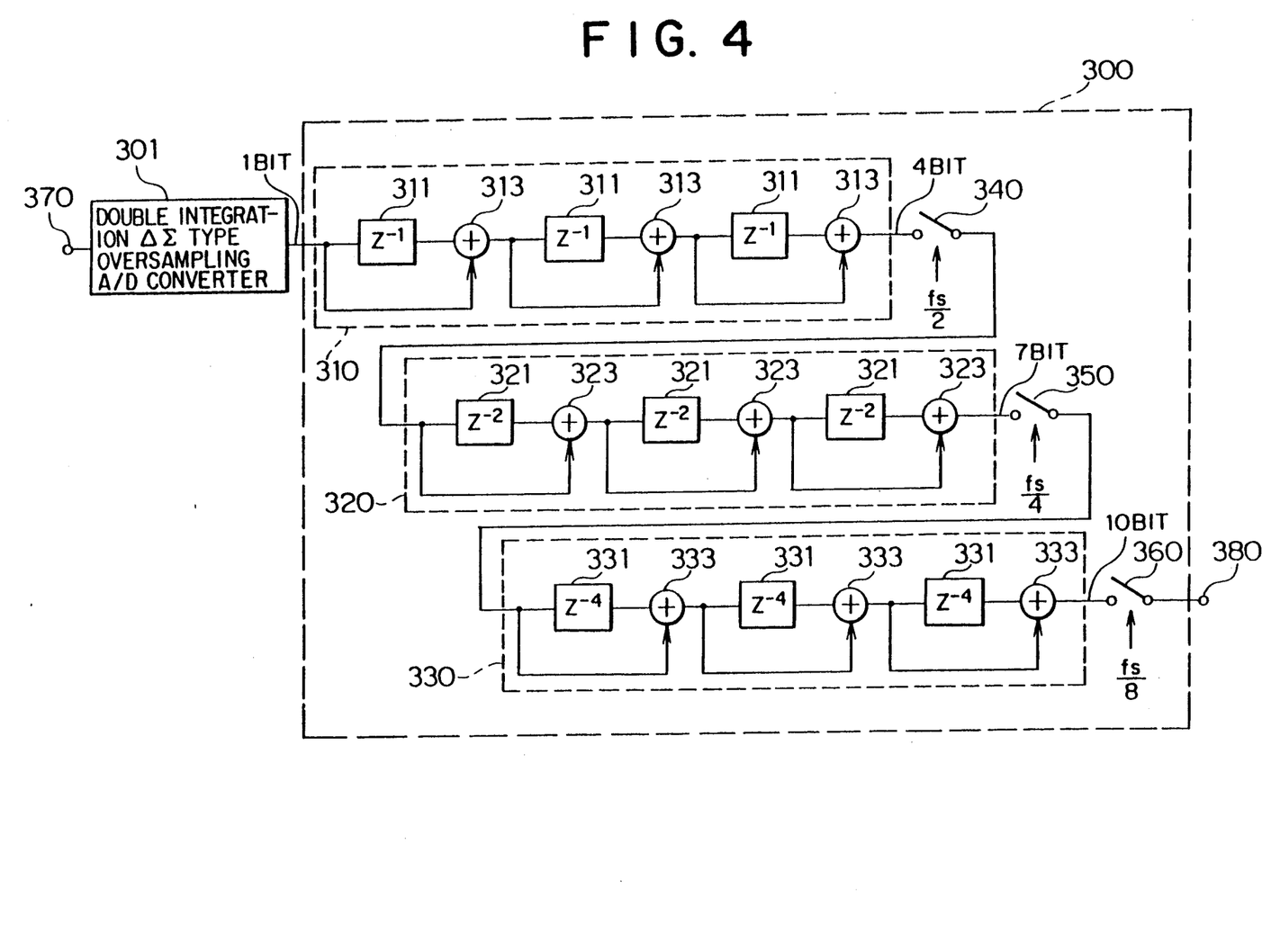
FIG. 4 is a block diagram showing the construction of a sampling frequency conversion apparatus used for a 2-order $\Delta\Sigma$ modulation type A/D converter.

FIG. 4 is a block diagram showing the construction of a sampling frequency conversion apparatus of another embodiment according to the present invention.

As shown in the figure, an output signal of a 2-order Δ Σ modulation type A/D converter 301 is connected to a sampling frequency conversion apparatus 300.

Though output signals from Δ Σ modulation type A/D converter and MASH type A/D converter are 1 bit or several bits, short bit length, they are over-sampled so as to have information in the direction of time axis. Thus, in order to obtain a high accuracy signal, it is required that a digital filter extract components in the low band and sampling frequency be decreased.

The sampling frequency conversion apparatus 300 is composed of a low pass filter 310, a resampler 340, a low pass filter 320, a resampler 350, a low pass filter 330, and a resampler 360, which are serially connected in the order thereof. Reference numeral 370 represents an input terminal. Reference numeral 380 represents an output terminal.

The low pass filter 310 represents a 3rd-order low pass filter where 1st-order low pass filters are serially connected in three stages, each single integration low pass filter is composed of a delay device 311 for delaying a signal by one sampling cycle and an adder 311.

The low pass filter 320 is a 3rd-order low pass filter where 1st-order low pass filters are serially connected in three stages, each 1st-order low pass filter is composed of a delay device 321 for delaying a signal by two sampling cycles and an adder 323.

The low pass filter 330 is a 3rd-order low pass filter where 1st-order low pass filters are serially connected in three stages, each 1st-order low pass filter is composed of a delay device 331 for delaying a signal by four sampling cycles and an adder 333. These low pass filters 310, 320, and 330 increase the bit length of signals being input by 3 bits and output them. In other words, although the bit length of an output signal of the 2nd-order $\Delta \Sigma$ modulation type A/D converter 301 is 1 bit, the bit length of the output signal of the first stage low pass filter 310 is 4 bits; that of the second stage low pass filter 320 is 7 bits; and that of the third stage low pass filter 330 is 10 bits.

Thus, the earlier the stage of the low pass filter, the shorter the bit length. Consequently, in the later stages with a longer bit length, the sampling frequencies are decreased and thereby the apparatus can be readily operated at a high speed.

The transmission function of the sampling frequency conversion apparatus 300 is given by the following equation.

$$(1+z^{-1})^3(1+z^{-2})^3(1+z^{-4})^3$$
$$=(1+z^{-1}+z^{-2}+z^{-3}+z^{-4}+z^{-5}+z^{-6}+z^{-7})^3$$

Thus, the sampling frequency conversion apparatus 300 can have the same characteristics as that of the conventional decimation filter shown in FIGS. 8 and 9. Further, the above structure allows to constitute a filter without using any multiplier. In addition, the aliasing noise characteristic of the sampling frequency conversion apparatus 300 is the same as that of the conventional decimation filter.

In the sampling frequency conversion apparatus 300, the low order low pass filters and the resamplers are serially connected in three stages. However, the number of stages of the low pass filters to be connected is not limited to 3. It is possible to construct the low pass filters with large integration orders.

Figure 5:
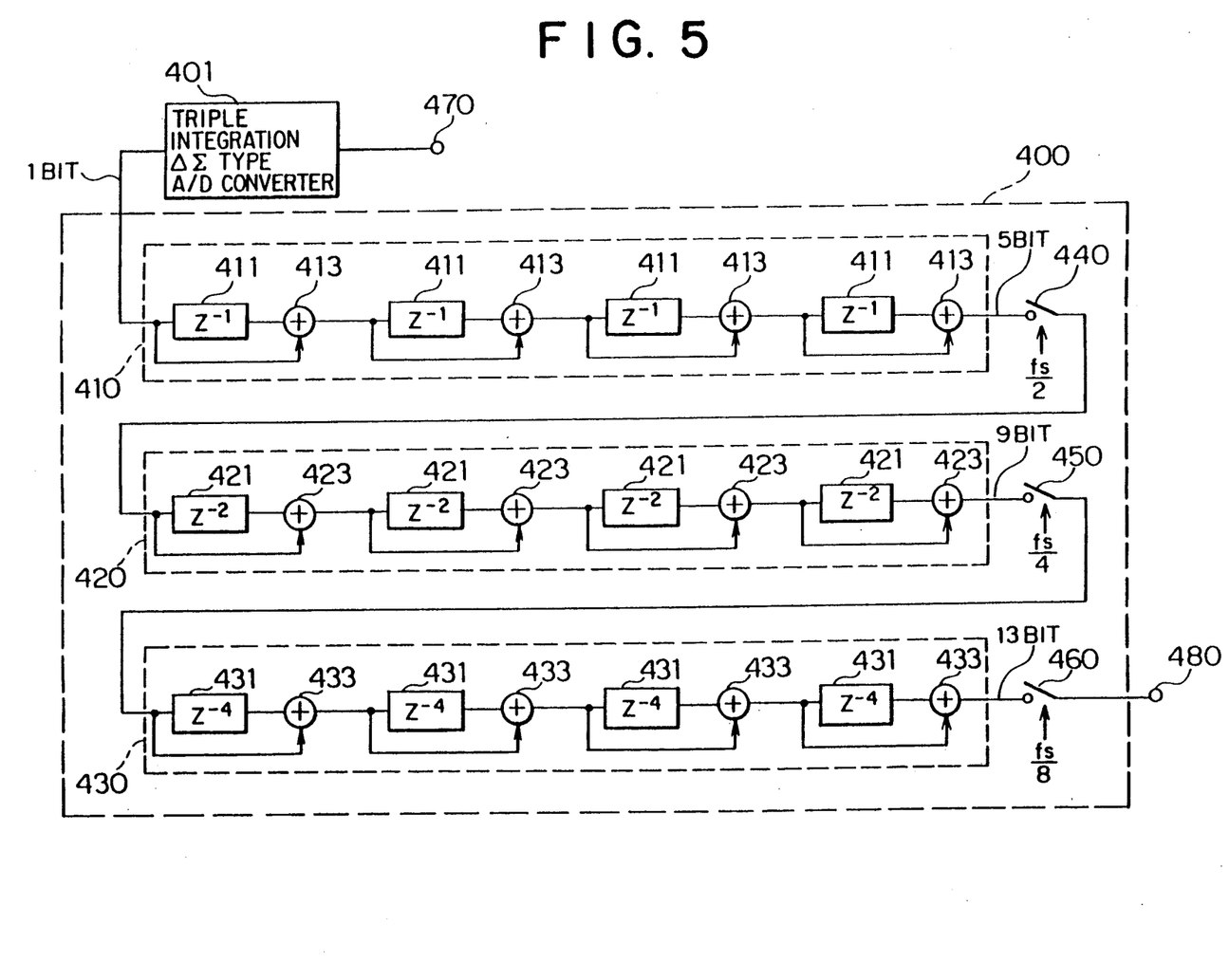
FIG. 5 is a block diagram showing the construction of a sampling frequency conversion apparatus used for a 3-order $\Delta\Sigma$ type A/D converter.

FIG. 5 is a block diagram showing the construction of a sampling frequency conversion apparatus of an embodiment used for a triple integration $\Delta \Sigma$ type A/D converter.

As shown in the figure, an output of a triple integration $\Delta \Sigma$ type A/D converter 401 is connected to a sampling frequency conversion apparatus 400. The sampling frequency conversion apparatus 400 is composed of a low pass filter 410, a resampler 440, a low pass filter 420, a resampler 450, a low pass filter 430, and a resampler 460, which are serially connected in the order thereof. Reference numeral 470 represents an input terminal. Reference numeral 480 represents an output terminal.

The low pass filter 410 is a 4th-order low pass filter where 1st-order low pass filters are serially connected in four stages, each of 1st-order low pass filter is composed of a delay device 411 for delaying a signal by one sampling cycle and an adder 413. The low pass filter 420 is a 4th-order low pass filter where 1st-order low pass filters are serially connected in four stages, each single integration low pass filter is composed of a delay device 421 for delaying a signal by two sampling cycles and an adder 423. The low pass filter 430 is a 4th-order low pass filter where 1st-order low pass filters are serially connected in four stages, each 1st-order low pass filter is composed of a delay device 431 for delaying a signal by four sampling cycles and an adder 433. The low pass filters 410, 420, and 430 increase the bit length of the input signals by 4 bits and then output the resultant signals.

When the sampling frequency of the signal which is output from the 3rd-order $\Delta \Sigma$ type A/D converter 401 is fs, the resamplers 440, 450, and 460 resample input signals with frequencies of fs/2, fs/4, and fs/8, respectively.

The number of orders of the low pass filters of the sampling frequency conversion apparatus 400 is four so as to suppress the noise having the characteristic of the 3rd-order noise shaping. In addition, in the sampling frequency conversion apparatus 400, the number of bits of the input is one; that of the output of the low pass filter 410 is five; that of the output of the low pass filter 420 is nine; and that of the output of the low pass filter 430 is 13. In other words, their signal bit length of each low pass filter increments by 4.

Figure 6:
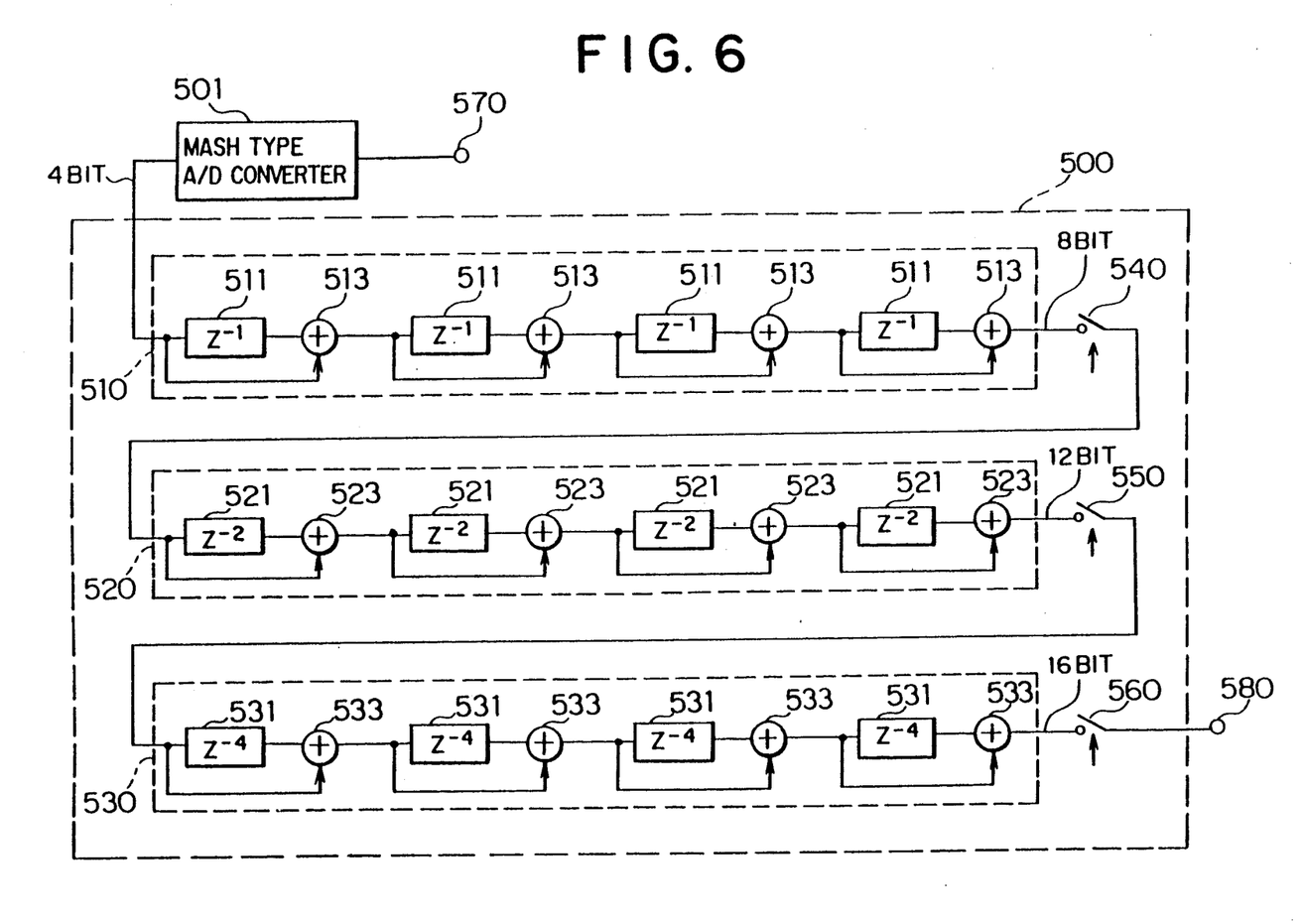
FIG. 6 is a block diagram showing the construction of a sampling frequency conversion apparatus used for a decimation filter disposed in the following stage of an MASH type A/D converter.

FIG. 6 is a block diagram showing the construction of a sampling frequency conversion apparatus used for a decimation filter disposed in the just following stage of a MASH type A/D converter (reference document: Matuya Y. et al, A 16-bit oversampling A/D conversion technology using triple integration noise shaping", IEEE J. Solid-State Circuits, Vol. SC-22 No. 6, pp. 921-929, December 1987).

As shown in the figure, the output of a MASH type A/D converter 501 is input to a sampling frequency conversion apparatus 500.

The sampling frequency conversion apparatus 500 is composed of a low pass filter 510, a resampler 540, a low pass filter 520, a resampler 550, a low pass filter 530, and a resampler 560, which are serially connected. Reference numeral 570 represents an input terminal. Reference numeral 570 represents an output terminal. Reference numeral 580 represents an output terminal.

The low pass filter 510 is a 4th-order low pass filter where 1st-order low pass filters are serially connected in four stages, each 1st-order low pass filter is composed of a delay device 511 for delaying a signal by one sample and an adder 513. The low pass filter 520 is a 4th-order low pass filter where 1st-order low pass filters are serially connected in four stages, each single integration low pass filter is composed of a delay device 521 for delaying a signal by two sampling cycles and an adder 523. The low pass filter 530 is a 4th-order low pass filter where 1st-order low pass filters are serially connected in four stages, each single integration low pass filter is composed of a delay device 531 for delaying a signal by four sampling cycles and an adder 533. The low pass filters 510, 520, and 530 increase the bit length of the input signals by 4 bits and output the resultant signals.

In addition, since the 3rd-order MASH type A/D converter 501 outputs a signal of four bits, a signal of four bits is input to the sampling frequency conversion device 500. Moreover, since the 3rd-order MASH type A/D converter 501 is of 3rd-order type, from the view of the noise shaping characteristic, the low pass filters should have a characteristic with respect to the 4th-order or greater. In addition, the bit length of the output signal of the low pass filter 510 is 8 bits; that of the low pass filter 520 is 12 bits; and that of the low pass filter 530 is 16 bits.

Like the above mentioned sampling frequency conversion apparatus, in this sampling frequency conversion apparatus 500, the number of bits in the earlier stages which are operated at a high speed is small. In the later stages where the number of bits increases, the sampling clock frequencies are decreased. Thus, the apparatus can be readily operated at a high speed. The filter characteristic of the sampling frequency conversion apparatus 500 is the same as that of the conventional decimation filter shown in FIG. 9 where the number of the delay devices 3 are seven and they are connected in three stages.

Figure 7:
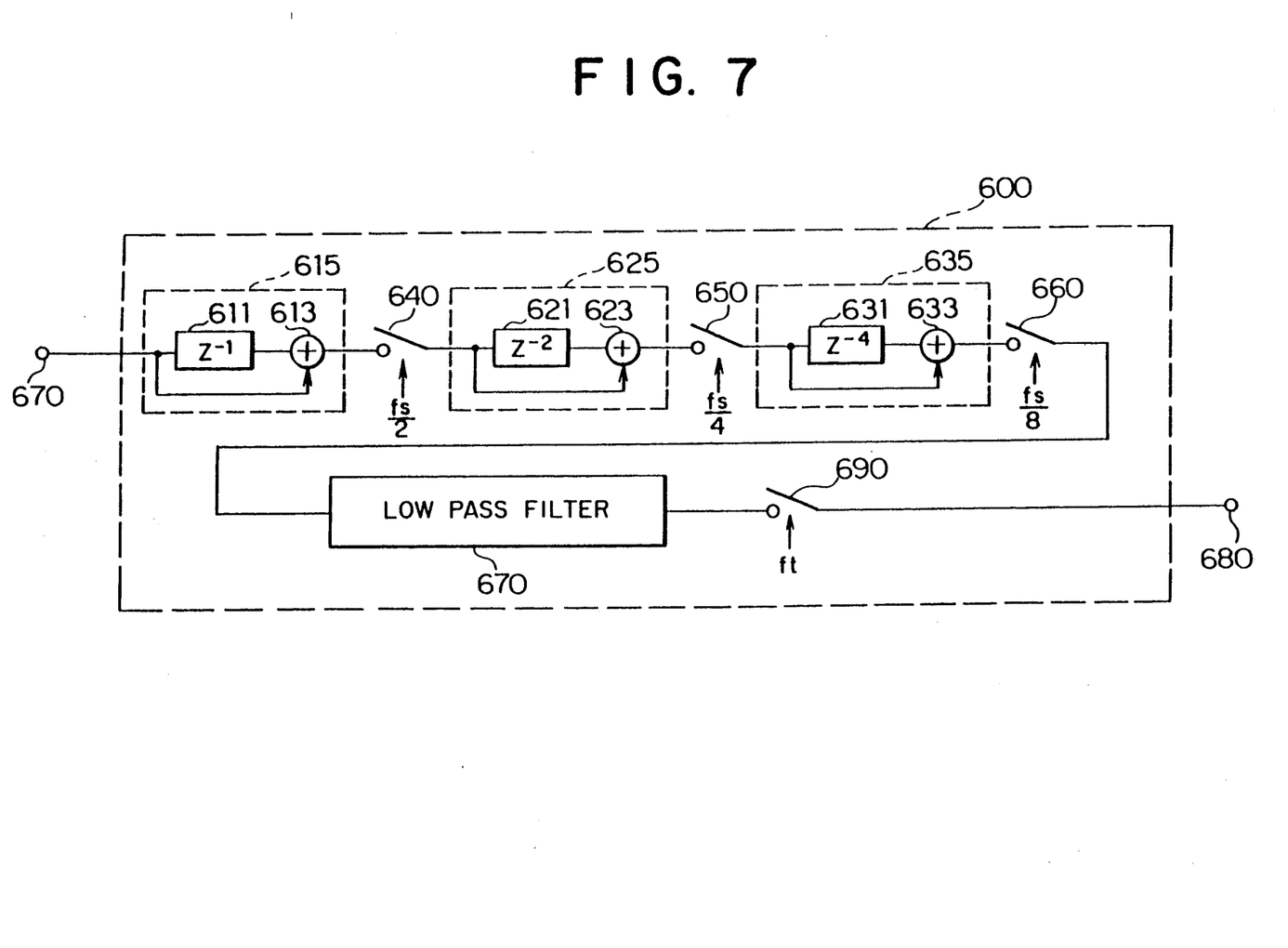
FIG. 7 is a block diagram showing the construction of a sampling frequency conversion apparatus, in the earlier stages thereof, the bit length of signals being increased and then the signals being resampled with low sampling frequencies, in the later stages, a conventional low pass filter and a resampler being used.

FIG. 7 is a block diagram showing the construction of a sampling frequency conversion apparatus of another embodiment according to the present invention.

In this sampling frequency conversion apparatus, in the earlier stages, while the bit length of signals is increased, the sampling frequencies are decreased. In contrast, in the latest stage, the conventional low pass filter and the resampler are used.

As shown in the figure, the sampling frequency conversion apparatus 600 is composed of a low pass filter 615, a resampler 640, a low pass filter 625, a resampler 650, a low pass filter 635, a resampler 660, a low pass filter 670, and a resampler 690, which are serially connected in the order thereof. Reference numeral 670 represents an input terminal. Reference numeral 680 represents an output terminal.

The low pass filter 615 is a 1st-order low pass filter, which is composed of a delay device 611 and an adder 613. The low pass filter 625 is a 1st-order low pass filter, which is composed of a delay device 621 and an adder 623. The low pass filter 635 is a 1st-order low pass filter, which is composed of a low pass filter 631 and an adder 633. The low pass filters 615, 625, and 635 increase the bit length of the input signals by one bit and output the resultant signals. When the sampling frequency of the input signal is fs, the resampling frequencies of the resamplers 640, 650, and 660 are fs/2, fs/4, and fs/8. The low pass filter 670 is composed of an FIR filter or IIR (Infinite Impulse Response) filter, for example as shown in FIG. 2. These filters have a characteristic for satisfactorily suppressing the aliasing noise component which occurs when the input signals are sampled at a frequency of ft by the resampler 690.

As is described above, according to the present invention, sampling frequency converters, each of which is composed of a low pass filter whose bit length of the output signal is longer than that of the input signal and a resampler are serially connected in a plurality of stages. Thus, in the earlier stages which require high speed operations, the bit length is short. In contrast, in the later stages where the bit length is large, the sampling frequencies are decreased. Consequently, the apparatus can be operated at a high speed and constructed at a low cost.

What is claimed is:

1. A sampling frequency conversion apparatus, comprising:
   a first digital filter for receiving an input signal and for outputting a first output signal having a longer bit length than that of the input signal, wherein said first digital filter is an FIR filter for attenuating a band to become aliasing noise due to a first sampling means;
   said first sampling means for sampling the first output signal output from said first digital filter at a first sampling frequency, to thereby generate a second output signal;
   a second digital filter for receiving said second output signal from said first sampling means and for outputting a third output signal having a longer bit length than that of said second output signal; and
   a second sampling means for sampling the third output signal output from said second digital filter at a second sampling frequency, to thereby output a fourth output signal;
   wherein said second sampling frequency is less than said first sampling frequency.

2. The sampling frequency conversion apparatus as set forth in claim 20, further comprising a delta sigma type A/D converter for generating the input signal.

3. The sampling frequency conversion apparatus as set forth in claim 20, further comprising a MASH type A/D converter for generating the input signal.

4. A sampling frequency conversion apparatus, comprising:
   a first digital filter for receiving an input signal and for outputting a first output signal having a longer bit length than that of the input signal, wherein said first digital filter is an FIR filter for attenuating a band to become aliasing noise due to a first sampling means;
   said first sampling means for sampling the first output signal output from said first digital filter at a first sampling frequency, to thereby generate a second output signal;
   a second digital filter for receiving said second output signal from said first sampling means and for outputting a third output signal having a longer bit length than that of said second output signal; and
   a second sampling means for sampling the third output signal output from said second digital filter at a second sampling frequency, to thereby output a fourth output signal;
   wherein said second sampling frequency is one-half of the first sampling frequency.

5. A sampling frequency conversion apparatus, comprising:
   a first digital filter for receiving an input signal and for outputting a first output signal having a longer bit length than that of the input signal, wherein said first digital filter is constructed by connecting 1st-order movement averaging filters in multi-stages so as to attenuate a band to become aliasing noise due to a first sampling means;
   said first sampling means for sampling the first output signal output from said first digital filter at a first sampling frequency, to thereby generate a second output signal;
   a second digital filter for receiving said second output signal from said first sampling means and for outputting a third output signal having a longer bit length than that of said second output signal; and
   a second sampling means for sampling the third output signal output from said second digital filter at a second sampling frequency, to thereby output a fourth output signal;
   wherein said second sampling frequency is less than said first sampling frequency.

6. A sampling frequency conversion apparatus, comprising:
   a first digital filter for receiving an input signal and for outputting a first output signal having a longer bit length than that of the input signal, wherein said first digital filter is constructed by connecting 1st-order movement averaging filters in multi-stages so as to attenuate a band to become aliasing noise due to a first sampling means;
   said first sampling means for sampling the first output signal output from said first digital filter at a first sampling frequency, to thereby generate a second output signal;
   a second digital filter for receiving said second output signal from said first sampling means and for outputting a third output signal having a longer bit length than that of said second output signal; and a second sampling means for sampling the third output signal output from said second digital filter at a second sampling frequency, to thereby output a fourth output signal;

wherein said second sampling frequency is one-half of the first sampling frequency.

7. A sampling frequency conversion apparatus, comprising:

a first digital filter for receiving an input signal and for outputting a first output signal having a longer bit length than that of the input signal;

a first sampling means for sampling the first output signal output from said first digital filter at a first sampling frequency, to thereby generate a second output signal;

a second digital filter for receiving said second output signal from said first sampling means and for outputting a third output signal having a longer bit length than that of said second output signal;

a second sampling means for sampling the third output signal output from said second digital filter at a second sampling frequency, to thereby output a fourth output signal;

a third digital filter for receiving said fourth output signal and for attenuating a particular band of the fourth output signal, to thereby generate a fifth output signal; and a third sampling means for sampling the fifth output signal output from said third digital filter at a particular sampling frequency and for outputting a signal of the same bit length as the fourth output signal;

wherein said second sampling frequency is less than said first sampling frequency.

8. A sampling frequency conversion apparatus, comprising:

a first digital filter for receiving an input signal and for outputting a first output signal having a longer bit length than that of the input signal;

a first sampling means for sampling the first output signal output from said first digital filter at a first sampling frequency, to thereby generate a second output signal;

a second digital filter for receiving said second output signal from said first sampling means and for outputting a third output signal having a longer bit length than that of said second output signal;

a second sampling means for sampling the third output signal output from said second digital filter at a second sampling frequency, to thereby output a fourth output signal;

a third digital filter for receiving said fourth output signal from said second sampling means and for outputting a fifth output signal having a longer bit length than that of said fourth output signal; and a third sampling means for sampling the fifth output signal output from the third digital filter at a third frequency, to thereby output a sixth output signal;

wherein said second sampling frequency is less than said first sampling frequency; and wherein said third frequency is less than said second frequency.

9. The sampling frequency conversion apparatus as set forth in claim 8, wherein said third sampling frequency is one-half of the second sampling frequency.

10. The sampling frequency conversion apparatus as set forth in claim 8, wherein said apparatus further comprises:

a fourth digital filter for receiving said sixth output signal and for attenuating a particular band of the sixth output signal, to thereby generate a seventh output signal; and a fourth sampling means for sampling the seventh output signal output from said fourth digital filter at a particular sampling frequency and for outputting a signal of the same bit length as the sixth output signal.

* * * * *

UNITED STATES PATENT AND TRADEMARK OFFICE
CERTIFICATE OF CORRECTION

PATENT NO. : 5,191,334
DATED : March 2, 1993
INVENTOR(S) : AKIRA YASUDA

It is certified that error appears in the above-indentified patent and that said Letters Patent is hereby corrected as shown below:

In column 8, line 4, change "Claim 20" to --Claim 1--.

In column 8, line 7, change "Claim 20" to --Claim 1--.

Signed and Sealed this

Twenty-third Day of August, 1994

Attest:

BRUCE LEHMAN

*Attesting Officer*   *Commissioner of Patents and Trademarks*